(12) United States Patent
Sinclair

(10) Patent No.: US 7,482,664 B2
(45) Date of Patent: Jan. 27, 2009

(54) OUT-OF-PLANE ELECTROSTATIC ACTUATOR

(75) Inventor: Michael J. Sinclair, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 28 days.

(21) Appl. No.: 11/275,486

(22) Filed: Jan. 9, 2006

(65) Prior Publication Data

US 2007/0158767 A1    Jul. 12, 2007

(51) Int. Cl.
*H01L 29/84* (2006.01)
(52) U.S. Cl. .................................. 257/415; 257/414
(58) Field of Classification Search .......... 257/414–419
See application file for complete search history.

(56) References Cited

U.S. PATENT DOCUMENTS

| | | | |
|---|---|---|---|
| 6,275,325 B1 | 8/2001 | Sinclair | |
| 6,351,051 B1 | 2/2002 | Sinclair et al. | |
| 6,422,011 B1 | 7/2002 | Sinclair | |
| 6,465,929 B1 | 10/2002 | Levitan et al. | |
| 6,529,310 B1 * | 3/2003 | Huibers et al. | 359/291 |
| 6,567,715 B1 | 5/2003 | Sinclair et al. | |
| 6,590,267 B1 * | 7/2003 | Goodwin-Johansson et al. | 257/415 |
| 6,600,851 B2 | 7/2003 | Aksyuk et al. | |
| 6,675,578 B1 | 1/2004 | Sinclair | |
| 6,708,492 B2 | 3/2004 | Sinclair | |
| 6,720,851 B2 * | 4/2004 | Hallbjorner et al. | 335/78 |
| 6,734,512 B2 * | 5/2004 | Suzuki | 257/414 |
| 6,775,048 B1 | 8/2004 | Starkweather et al. | |
| 6,804,959 B2 | 10/2004 | Sinclair | |
| 6,815,739 B2 * | 11/2004 | Huff et al. | 257/275 |
| 2003/0160540 A1 * | 8/2003 | Miller et al. | 310/309 |
| 2006/0006484 A1 * | 1/2006 | Seneviratne et al. | 257/415 |

OTHER PUBLICATIONS

Jeong, Ki-Hun et al. "A novel microfabrication of a self-aligned vertical comb drive on a single SOI wafer for optical MEMS applications", Journal of Micromechanics and Microengineering, Nov. 16, 2004, pp. 277-281.

Koester, David et al. "PolyMUMPs Design Handbook", 2003, 22 pages.

Zhang, Jianglong et al. "Digitally Positioned Micromirror for Open-Loop Controlled Applications", 4 pages.

* cited by examiner

*Primary Examiner*—Jerome Jackson, Jr.
*Assistant Examiner*—Allison P Bernstein
(74) *Attorney, Agent, or Firm*—Lee & Hayes, PLLC

(57) ABSTRACT

A micro-electromechanical device includes a semiconductor substrate and an arm coupled to the substrate. The arm is pivotable out-of-plane relative to the substrate and at least a portion of the arm is deformable. The deformable portion of the arm deforms as the arm pivots relative to the substrate.

17 Claims, 4 Drawing Sheets

OUT-OF-PLANE ELECTROSTATIC ACTUATOR

BACKGROUND

Micro-electromechanical systems (MEMS) devices have been used to control very small components formed on semiconductor substrates. MEMS electrostatic actuators require very low power and potentially fast response. For static response, no current typically flows except due to parasitics. Hence, almost no power is consumed, making electrostatic MEMS actuators ideal for move-and-hold actuators.

Out-of-plane electrostatic actuators usually consist of either a vertical comb drive or a parallel plate capacitor where one of the plates is allowed to move. Vertical comb drives require multiple complex processes to generate electro-mechanical structures in vertically stacked layers using, for example, expensive silicon on insulator (SOI) and deep reactive ion etch (DRIE) processes. In the case of existing parallel plate capacitor-type actuators, a common limitation is "snap down," where the stable travel distance is limited to around ⅓ of the total plate separation before the movable capacitor plate "snaps down" into contact with the stationary capacitor plate. In addition, both of these types of existing actuators provide a limited range of motion.

SUMMARY

This Summary is provided to introduce a selection of concepts in a simplified form that are further described below in the detailed description. This Summary is not intended to identify key features or essential features of the claimed subject matter, nor is it intended to be used as an aid in determining the scope of the claimed subject matter.

In view of the above, micro-electromechanical devices, systems including such devices, and methods of using such devices are disclosed. In one aspect, a micro-electromechanical device includes an arm that is pivotable out-of-plane relative to a substrate, such that a portion of the arm deforms as the arm pivots relative to the substrate.

In another aspect, a micro-electromechanical device includes an arm that is pivotable relative to a substrate through an angle greater than $\tan^{-1}(h/L)$, where h is a spacing between an electrostatically attractable portion of the arm and the substrate when the device is in an unactuated state, and L is a length of the electrostatically attractable portion of the arm.

In yet another aspect, a method includes elastically deforming a deformable portion of an arm in the process of pivoting the arm.

BRIEF DESCRIPTION OF THE DRAWINGS

In the Figures, the left-most digit of a component reference number identifies the particular Figure in which the component first appears.

DETAILED DESCRIPTION

Overview

This disclosure is directed to micro-electromechanical systems (MEMS) devices, systems including such devices, and methods of making such devices. The implementations are described in the context of electrostatic MEMS actuators for directing mirrors out-of-plane in, for example, optical systems, such as projection systems, fiber optic systems, and the like. However, the implementations described herein may be used in other environments and are applicable to other contexts. For example, while the implementations are described as moving reflective surfaces, such as micro-mirrors, they may also be used for movement and/or actuation of various other implements, such as optical fibers, terminals, switches, motors, and the like.

Implementations described herein provide electrostatically actuated MEMS devices that do not suffer from significant snap down, and that have a greater range of motion than most existing capacitor plate-type actuators.

Exemplary MEMS Device

Figure 1:
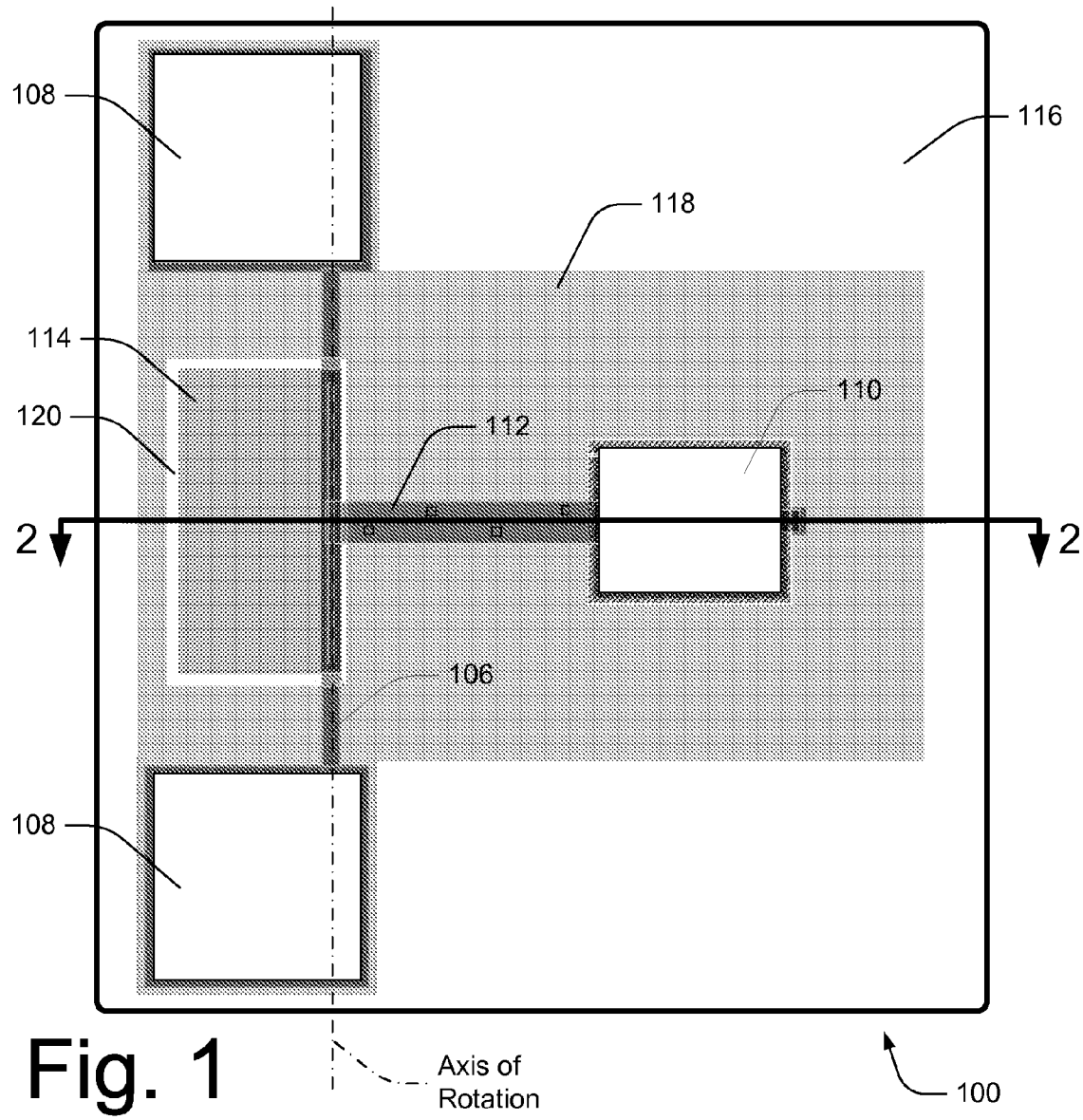
FIG. 1 is a plan view of an exemplary micro-electromechanical device according to one implementation.

FIG. 1 is a plan view of an exemplary MEMS device comprising an actuator 100 formed on a semiconductor substrate 102, according to one implementation. The actuator 100 can be formed using micromachining techniques, as described below in the section entitled Exemplary Method of Manufacturing. The actuator 100 generally comprises an arm 104 pivotably coupled to the substrate 102 via a torsional member 106 and at least two probe electrodes 108. The arm 104 is pivotable relative to the substrate 102 about an axis of rotation defined by the torsional member 106. A micro-mirror 110 or other implement is coupled to an implement bearing portion 112 of the arm 104. The end of the arm 104 opposite the implement bearing portion 112 comprises an attractable portion 114, such as a movable capacitor plate, which is electrostatically attractable toward the substrate 102 to pivot the arm 104 of the actuator 100, as described further below. In contrast to conventional rigid capacitor plate actuators, the attractable portion 114 is elastically deformable to allow for greater articulation of the arm 104 relative to the substrate 102, as described further in the section entitled Exemplary Modes of Operation.

The implement bearing portion 112 of the arm 104 may be substantially rigid or may be elastically deformable, depending on the desired actuation performance (e.g., selective, linear, and/or resonant actuation) of the actuator 100.

The various types of actuation performance are discussed further below in the section entitled Exemplary Method(s) of Use. The relative rigidity/deformability of the portions of the arm 104 depends on material selection, heat treatments, doping, and other manufacturing processes.

An electrically insulating layer 116 is disposed on the substrate 102, between the substrate 102 and the actuator 100, to electrically isolate the actuator 100 from the substrate 102.

A shielding layer 118 is adhered to the electrically insulating layer 116, between the actuator 100 and the electrically insulating layer 116. A gap in the shielding layer 118 is left below at least a portion of the area of the attractable portion 114 of the arm 104, leaving an unshielded area 120 below the attractable portion 114.

Figure 2:
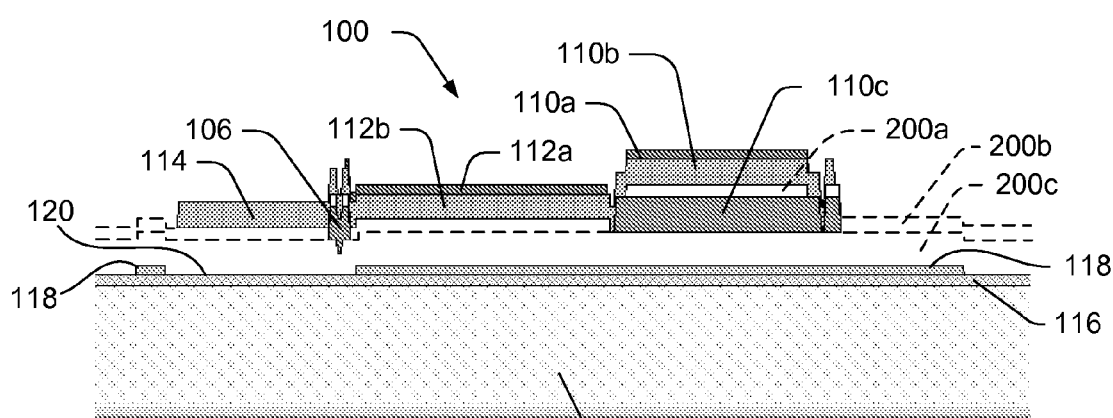
FIG. 2 is a cross-sectional view of the micro-electromechanical device of FIG. 1, taken along line 2-2 in FIG. 1.

FIG. 2 is a cross-sectional view (scaled by a factor of about 8 in the vertical dimension for clarity) of the actuator 100. In the implementation shown, the attractable portion 114 comprises a single-layer polysilicon capacitor plate, while the micro-mirror 110 and the implement bearing portion 112 comprise multiple layers. The micro-mirror 110 includes a metal layer 110a, which defines a reflective surface of the micro-mirror 110, and first and second polysilicon layers 110b and 110c with sacrificial material in a space 200a therebetween. The space 200a encloses the sacrificial layer, which is prevented from being removed during manufacturing. Solvent used to remove other sacrificial layers is not allowed to reach the sacrificial layer in space 200a. Forming the micro-mirror 110 with the sacrificial material in space 200a and the relatively thick lower polysilicon layer 110c provides additional stiffness to the micro-mirror (by the composite build-up) and prevents the mirror from curling due to residual stresses from application of the metal layer 110a.

The metal layer 110a provides the reflective surface of the micro-mirror 110 and can be polished using any known polishing technique (such as, for example, chemical-mechanical polishing) to provide the desired reflective finish.

The implement bearing portion 112 of the arm includes a metal layer 112a formed on a polysilicon layer 112b.

In some instances it may be desirable to impart a curvature to the arm 104 to space the micro-mirror 110 away from the substrate 102. One reason to impart a curvature is to reduce "squeeze film damping" effects, which occur when a thin layer of fluid (in this case air) is trapped between two parallel moving plates. In the case of movable micro-mirrors, when the mirror is moved quickly away from the substrate a vacuum can be created behind the mirror, which resists movement of the mirror and reduces the effects of resonance of the mirror by deceasing the quality or Q-factor of the system. Thus, in cases where fast response and/or resonance of the mirror are desired, it may be advantageous to space the mirror further from the substrate. By applying the metal layer 112a at a temperature other than operating temperature, residual stresses can be imparted to the arm 104 to apply a curvature (not shown in this figure) to the arm 104. For example, if the metal layer 112a is applied at a temperature above the operating temperature of the actuator 100, as the metal layer 112a cools, it will contract thereby curving the arm 104 upward. The degree of curvature can be controlled by controlling the thickness and application temperature of the applied metal layer 112a.

Figure 3A:
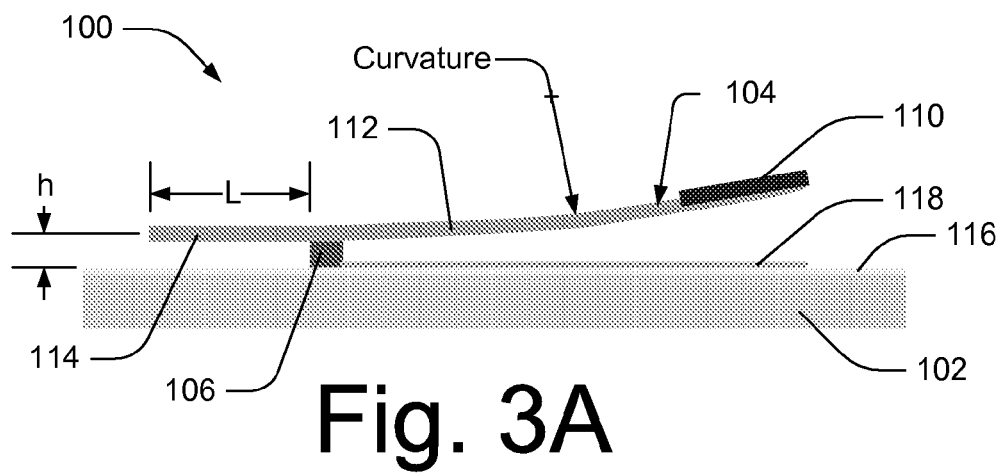
FIG. 3A is a schematic front view of an exemplary micro-electromechanical device according to one implementation in a neutral, unactuated position.
Figure 3B:
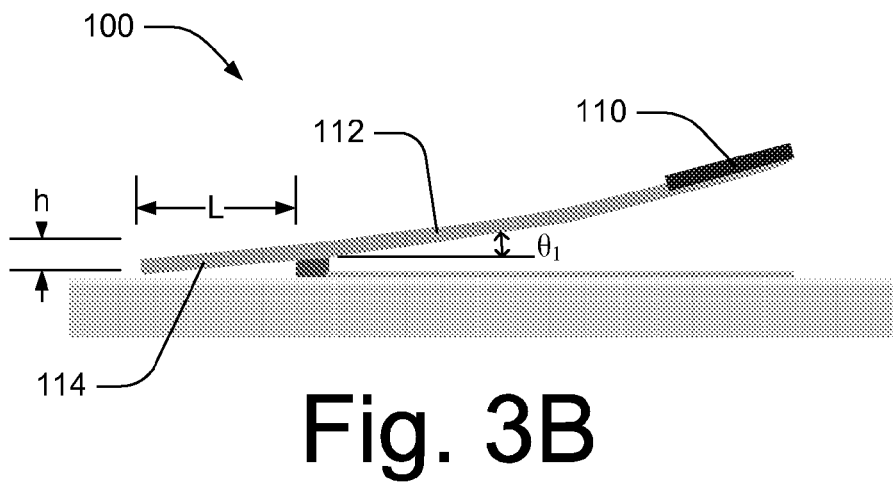
FIG. 3B is a schematic front view of the micro-electromechanical device of FIG. 3A in a partially actuated position.
Figure 3C:
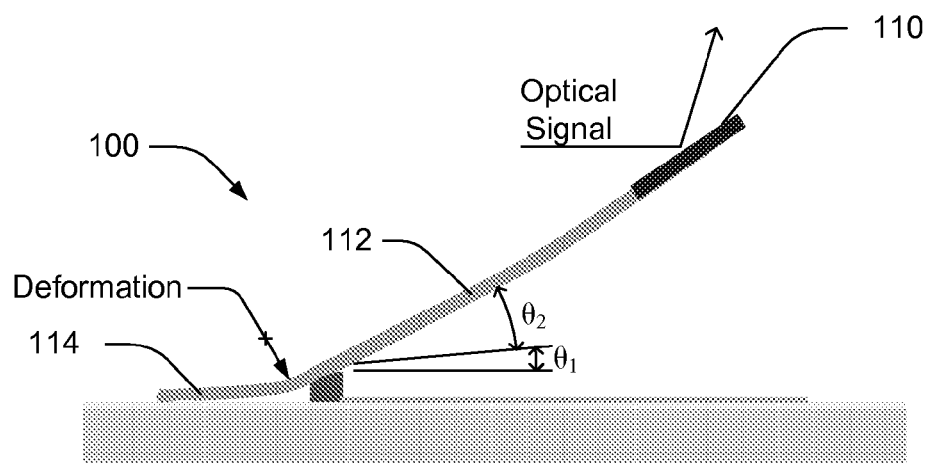
FIG. 3C is a schematic front view of the micro-electromechanical device of FIG. 3A in a further actuated position.

While the arm 104 is depicted as being substantially planar, the arm could be formed in virtually any shape and configuration. For example, as mentioned above, portions of the arm may be curved up or down in varying degrees (the implement bearing portion 112 is shown in FIGS. 3A-3C as having a slight upward curvature). Additionally or alternatively, the arm may include multiple curvatures, may be stepped (i.e., having two or more offset layers), or the like. Also, while the overall shape of the arm when viewed from the top is shown as being an elongated beam, the arms may have any other suitable shape in the plan view, such as circular, oval, square, rectangular, polygonal, as well as other geometrical and non-geometric shapes.

Sacrificial layers 200b and 200c (shown in dashed in FIG. 2) were stripped using a solvent during the manufacturing process, leaving the arm 104 suspended above the substrate 102 by the torsional member 106. (Note that sacrificial layer 200a of the micro-mirror 110 was not stripped as described above.) The torsional member 106 is electrically and mechanically connected at each end to the probe electrodes 108. The shielding layer 118 is electrically connected to the actuator 100, via the probe electrodes 108, so that the shielding layer 118 and the actuator 100 are at the same potential. This insures that torsional member 106, implement bearing portion 112 of arm 104, and micro-mirror 110 will not be acted upon when there is a voltage difference between the substrate 102 and the actuator 100. A signal can be applied at probe electrodes 108 to impart a potential difference between the substrate 102 and the actuator 100, thereby generating electrostatic force only between the substrate 102 and the attractable portion 114.

Exemplary Modes of Operation

FIGS. 3A-3C are schematic views of the exemplary MEMS device of FIG. 1, with the actuator 100 in various stages of actuation. In FIG. 3A, the actuator 100 and the substrate 102 are at substantially the same potential, and a spring force of the torsional member 106 holds the arm 104 in a neutral, unactuated position. FIG. 3A illustrates this neutral position with the arm being generally parallel with the plane of the substrate 102 (deviating slightly due to curvature of the arm). However, the orientation of the arm 104 relative to the substrate 102 in the neutral state may vary, depending on the size and shape of the arm, the spring constant of the torsional member, and the like.

FIG. 3B shows the actuator 100 when a potential difference is applied between the actuator 100 and the substrate 102. In response to the potential difference, the attractable portion 114 of arm 104 snaps down into contact with the insulating layer 116. This causes the arm 104 to pivot through a first angle $\theta_1$ and to lift the micro-mirror slightly. This initial amount of snap down is minimal and will be acceptable in most applications.

FIG. 3C shows the exemplary actuator 100 of FIG. 1 upon further increasing the potential difference. As the potential difference increases, the attractable portion 114 starts deforming, causing the free end of the attractable portion (the left end in FIG. 3C) to flatten against the insulating layer 116, and bending the attractable portion 114 near the torsional member 106. As the attractable portion 114 bends, the implement bearing portion 112 is caused to rotate through a second angle $\theta_2$, beyond the first angle $\theta_1$. Thus, the micro-mirror 110 or other implement is moved further away from (out-of-plane with) the substrate 102. The deformation force required to elastically deform the attractable portion 114 is nonlinear. This nonlinear deformation force at least partially offsets increases in electrostatic force due to the decrease in distance between the attractable portion 114 and the substrate 102 (the electrostatic force increases exponentially as a function of the inverse of the distance). Because the deformation force at least partially offsets the increased electrostatic force, the actuator does not suffer from snap down like conventional parallel plate capacitor actuators with linear spring constants.

Further increases in the actuation potential cause even further bending of the attractable portion 114, thereby rotating the implement bearing portion of the arm 112 even further out-of-plane relative to the substrate 102 than shown in FIG. 3C. Thus, the actuator 100 is capable of a much larger angle of actuation than can be achieved with conventional rigid body, out-of-plane parallel plate capacitor actuators, which are limited in travel to just the space (h) provided by a sacrificial layer.

Actuator 100 and other implementations described herein are capable of pivoting the actuator arm 104 out-of-plane relative to the substrate 102 through an angle $\theta_{total}$, which is greater than $\tan^{-1}$ (h/L), where h is a spacing between the electrostatically attractable portion 114 of the arm 104 and the substrate 102 when the device is in the unactuated state, and L is a length of the electrostatically attractable portion 114 of the arm. This condition is derived from the geometric relationship that the $\tan(\theta)=h/L$. Conventional rigid body, parallel plate capacitance actuators are incapable of pivoting an arm through an angle greater than $\tan^{-1}$ (h/L).

Over time, the foregoing devices may start to experience wear of the attractable portion 114 and/or the insulating layer 116 due to friction between those two elements during actuation. To prevent this occurrence, it may be desirable to provide a bearing or lubricating layer to reduce or eliminate friction between these two elements. Additionally or alternatively, it may be desirable to increase the hardness of these elements through material selection and/or manufacturing processes, to minimize the amount of wear on the parts.

Exemplary Method(s) of Use

Figure 4:
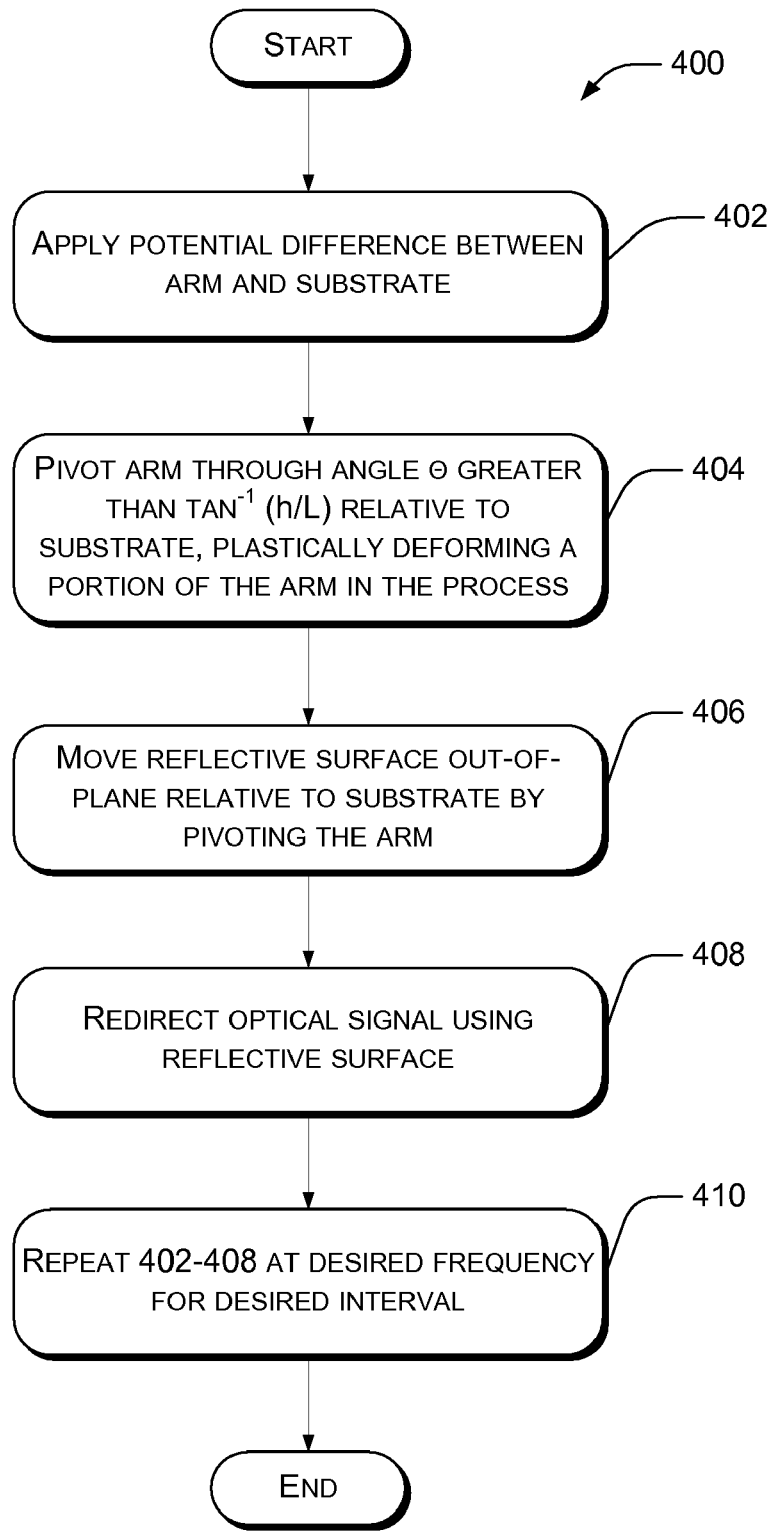
FIG. 4 is a flowchart showing an exemplary method of using a micro-electromechanical device.

FIG. 4 shows an exemplary method 400 of using a MEMS device, such as those described herein, to move an implement. The method begins at 402 by applying a potential difference between an arm and a substrate of a MEMS device. The potential difference generates an electrostatic force between an attractable portion of the arm and the substrate.

At 404 the arm is pivoted by the electrostatic force through an angle $\theta_{total}$ relative to the substrate, which is greater than $\tan^{-1}$ (h/L), where h is a spacing between an electrostatically attractable portion of the arm and the substrate when the device is in the unactuated state, and L is a length of the electrostatically attractable portion of the arm. In the process of pivoting the arm, a deformable portion of the arm is elastically deformed. The elastically deformation of the arm is non-linear and at least partially offsets in increase in the electrostatic force due to the decreased distance between the attractable portion of the arm and the substrate.

At 406 a reflective surface is moved out-of-plane relative to the substrate in the process of pivoting the arm of the device. The reflective surface is coupled to the arm, so as to be movable therewith.

At 408 an optical signal is redirected using the reflective surface. The optical signal may be an image signal, such as a portion of a video image to be projected onto a screen, a data signal, and the like. Redirecting an optical signal with the reflective surface may comprise redirecting the signal for further transmission, such as to an optical fiber, redirecting the signal for projection, such as to a lens or screen, or redirecting the signal for other purposes.

At 410 the foregoing acts 402-408 may be repeated selectively, at a desired frequency and/or for a desired interval. In this manner, actuation may be intermittent or continuous, and may be linear, resonant, or the like. The acts may be performed in response to user input, or may be controlled in whole or in part by a computer, processor, controller, or the like. Any known computing device can be used to control the actuators described herein.

Figure 5:
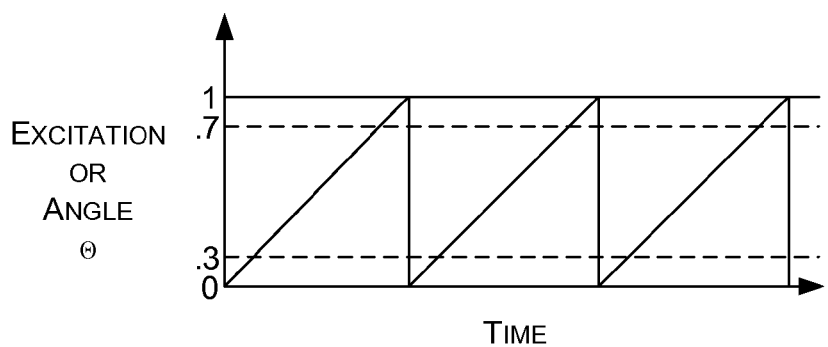
FIG. 5 is a graph showing an exemplary relationship of actuation angle or excitation versus time during linear actuation of the device of FIG. 1.

FIG. 5 shows one exemplary application of the method of FIG. 4, in which a mirror is moved out-of-plane in a linear response period. As shown in FIG. 5, the angle of the mirror is approximately linearly related to the voltage applied to the actuator. In this case, the lifting arm and mirror would be operated at non-resonant frequencies. The lifting arm would be made stiff so as not to flex so the mirror angle would be approximately equal to the pivot angle (with some variation for any initial curvature of the arm). Such linear response actuation may be used, for example, in a raster scan generator such as are used in a laser scan image projector, cathode ray tube (CRT) display, or camera. Such raster scan generators causes an optical signal to trace out a raster scan, such as how an electron beam traces out a raster on a phosphor in a CRT.

Typical time-based raster scanners use two axes of scanning—a horizontal or fast axis (generally about 15 KHz for the NTSC standard) and a vertical or slow axis (~60 Hz for the NTSC standard). The vertical (slow) axis of a raster scanner for an image display or camera requires a time-linear response. The slow axis requires a linear trace on the screen over time with a quick retrace. The scan angle or movement on the screen would resemble a high aspect ratio sawtooth wave, such as that shown in FIG. 5.

Figure 6:
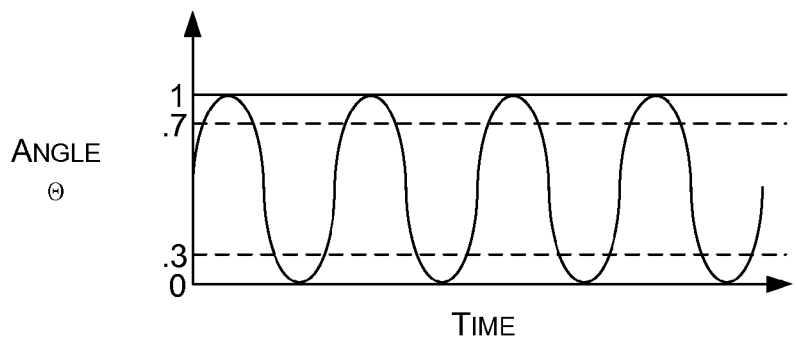
FIG. 6 is a graph showing an exemplary relationship of actuation angle or excitation versus time during resonant actuation of the device of FIG. 1.

FIG. 6 shows another exemplary application of the method of FIG. 4, in which a mirror is moved out-of-plane in a resonant response period. As shown in FIG. 6, the angle of actuation varies in a generally sinusoidal function relative to a voltage applied to the actuator. This sinusoidal motion allows the actuator to be operated at the resonance of the system. In this application, the implement bearing portion of the arm may be made flexible. Thus, as the voltage is applied to the actuator, the implement bearing portion of the arm acts much like a tuning fork, thereby allowing the mirror to deflect at a much larger angle, and with lower energy, than during linear response. Such resonant response actuation may be useful as, for example, a barcode scanner, a horizontal (fast) axis raster scan generator, or the like. Barcode scanning generally requires a relatively fast one-dimension scan. For a near-linear response (at resonance), the system would utilize only approximately the middle 70% of the sinusoidal waveform.

Thus, as discussed above, a MEMS device can be used to move an implement, such as, for example, a reflective surface, in any of the foregoing methods. Of course, the devices described herein may also be used to move other implements out-of-plane and may be used in other methods.

Figure 7:
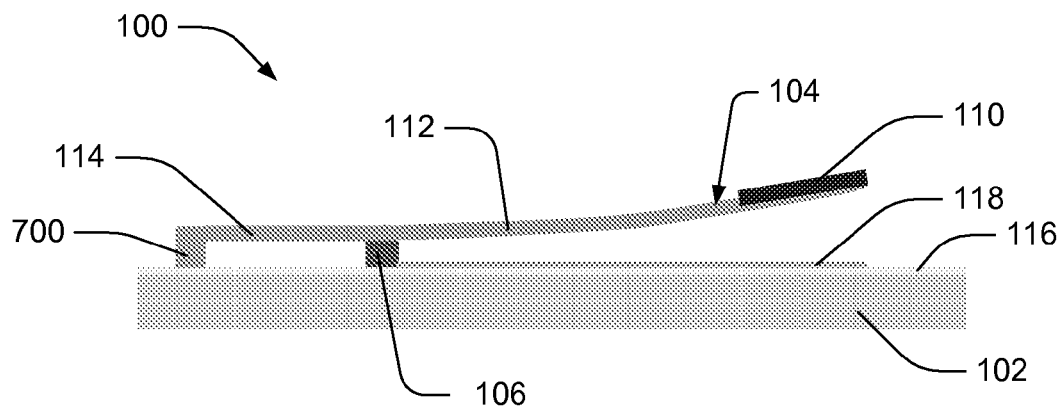
FIG. 7 is a schematic front view of an exemplary micro-electromechanical device according to another implementation.

FIG. 7 illustrates an exemplary MEMS device according to another possible implementation. The MEMS device of FIG. 7 is the same as that shown in FIGS. 3A-3C, except that a stop 700 is disposed between the free end of the attractable portion 114 of the arm 104 and the insulating layer 116. The stop 700 can be fixed to the arm 104 or the insulating layer 116. In either case, the stop 700 can be formed integrally as part of the respective arm 104 or insulating layer 116, or could be a separate layer attached to the respective arm 104 or insulating layer 116. If the stop 700 is fixed to the arm 104, then it may slide relative to the insulating layer 116, and vice versa.

In this implementation, when an electrostatic force is applied between the attractable portion 114 of the arm 104 and the substrate 102, the attractable portion 114 is attracted toward the substrate 102. However, because the attractable portion is supported at one end by the stop 700 and at the other end by the torsional member 106, a central portion of the attractable portion 114 will move toward the substrate 102. Thus, the attractable portion will start to bend in a generally U-shape, causing the arm 104 to rotate about the torsional member. As the electrostatic force is increased, the attractable portion 114 will begin to flatten out against the insulating layer 116 in a central region thereof, causing the arm 104 to rotate further about the torsional member 106 (similar to FIG. 3C).

Exemplary Method of Manufacturing

The MEMS devices described herein can be fabricated using any known micromachining processes, for example, the multi-user MEMS processes (MUMPs) described in the PolyMUMPs Design Handbook, Revision 10.0, by David Koester et al., MEMSCAP 2003. One MUMPs process provides three-layers of conformal polysilicon that are etched to create a desired physical structure. The first layer, designated POLY 0, is coupled to a supporting wafer, and the second and third layers, POLY 1 and POLY 2, respectively, are mechanical layers that can be separated from underlying structure by the use of sacrificial layers of deposited Oxide that separate layers and are removed during the process. A layer of silicon nitride is used to electrically isolate the substrate from the layers of polysilicon. A metal layer, such as, for example, gold, can be applied over the upper polysilicon layer. Details of the materials, layer thicknesses, tolerances, and the like can be found in the PolyMUMPs Design Handbook.

When the implementation of FIG. 2 is made by MUMPs processes, the shielding layer 118 corresponds to the POLY 0 layer of the MUMPs process. The lower layer 110c of the micro-mirror 110 and the torsional member 106 correspond to the POLY 1 layer of the MUMPs process. Layers 110b, 112b, and 114 correspond to the POLY 2 layer of the MUMPs process. The insulating layer 11 corresponds to the nitride layer of the MUMPs process. Layers 110a and 112a correspond to the metal layers of the MUMPs process. The sacrificial layers correspond to the Oxide layers described in the MUMPs process.

While specific materials and dimensions are described in the PolyMUMPs Design Handbook and/or the subject application, it should be understood that such are not limiting and that other materials and dimensions may be used to make the devices described herein.

The general MUMPs processes are well known to those of ordinary skill in the art. However, the MEMS devices described in the subject application use mask patterns specific to the structure of the devices described herein, which were not known prior to the subject application. Also, the steps for the MUMPs process may change as dictated by the MEMS Technology Applications Center. The MUMPs fabrication process is only one of several processes that can be used to fabricate the devices described herein. Other manufacturing processes that could be used to manufacture the devices described herein will be readily apparent to one skilled in the art.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A micro-electromechanical device comprising:
a semiconductor substrate;
an arm coupled to the substrate, the arm being pivotable out-of-plane relative to the substrate,
the arm comprising a deformable attractable portion and a non-deformable implement bearing portion, wherein the deformable attractable portion meets the non-deformable implement bearing portion at a torsional member,
wherein the deformable attractable portion of the arm pivots relative to the substrate and deforms when it contacts the substrate; and
an implement coupled to the implement bearing portion.

2. The micro-electromechanical device of claim 1, wherein the implement bearing portion of the arm is pivotable through a first angle relative to the substrate without deformation of the arm, and wherein the implement bearing portion of the arm is pivotable through a second angle, beyond the first angle, by deforming the deformable attractable portion of the arm.

3. The micro-electromechanical device of claim 1, wherein the force required to deform the deformable attractable portion of the arm increases nonlinearly as the arm pivots, thereby minimizing snap down.

4. The micro-electromechanical device of claim 1, the arm being actuatable to pivot by application of an electrostatic force.

5. The micro-electromechanical device of claim 1, wherein the arm comprises a beam for moving an implement and a capacitor plate which can be electrostatically attracted toward the substrate to pivot the arm.

6. The micro-electromechanical device of claim 1, further comprising a torsional spring the ends of which are anchored to the substrate, the arm being pivotally coupled to the substrate via the torsional spring.

7. The micro-electromechanical device of claim 1, wherein at least a portion of the arm has a curvature in an un-actuated state.

8. The micro-electromechanical device of claim 7, wherein the arm comprises two materials, one of the materials having been applied at a temperature above an operating temperature, such that at the operating temperature the aim has residual stresses which impart the curvature to the arm.

9. The micro-electromechanical device of claim 1, further comprising a reflective surface coupled to the arm for pivotable movement relative to the substrate.

10. The micro-electromechanical device of claim 1, further comprising an electrically insulating layer interposed between the substrate and the arm and a shielding electrode interposed between the electrically insulating layer and at least a portion of the arm.

11. An optical system comprising a micro-electromechanical device according to claim 1.

12. An electrostatically actuatable micro-electromechanical device comprising:
a substrate; and
an arm having a non-deformable implement bearing portion and a deformable electrostatically attractable portion, the arm being pivotally coupled to the substrate about an axis for out-of-plane rotation through an angle relative to the substrate,
wherein the deformable attractable portion meets the non-deformable implement bearing portion at a torsional member,
wherein the implement bearing portion rotates through a first angle without deforming the arm and a second angle by deforming the arm, the second angle is greater than $\tan^{-1}(h/L)$, where h is a spacing between the electrostatically attractable portion of the arm and the substrate when the device is in an unactuated state, and L is a length of the electrostatically attractable portion of the arm.

13. The electrostatically actuatable micro-electromechanical device of claim 12, wherein the deformable electrostatically attractable portion of the arm is deformed in order for the arm to be pivoted through the full angle.

14. The electrostatically actuatable micro-electromechanical device of claim 13, wherein the force required to deform the deformable electrostatically attractable portion of the arm increases non-linearly as the arm pivots, thereby minimizing snap down.

15. The electrostatically actuatable micro-electromechanical device of claim 12, further comprising a torsional spring, the ends of which are anchored to the substrate, the arm being pivotally coupled to the substrate via the torsional spring.

16. The electrostatically actuatable micro-electromechanical device of claim 12, wherein the implement bearing portion of the arm has a curvature in an un-actuated state.

17. The electrostatically actuatable micro-electromechanical device of claim 12, further comprising a reflective surface as an implement coupled to the implement bearing portion of the arm.

* * * * *

UNITED STATES PATENT AND TRADEMARK OFFICE
CERTIFICATE OF CORRECTION

| | |
|---|---|
| PATENT NO. | : 7,482,664 B2 |
| APPLICATION NO. | : 11/275486 |
| DATED | : January 27, 2009 |
| INVENTOR(S) | : Michael J. Sinclair |

It is certified that error appears in the above-identified patent and that said Letters Patent is hereby corrected as shown below:

In column 7, line 59, in Claim 3, delete "nonlinearly" and insert -- non-linearly --, therefor.

In column 8, line 12, in Claim 8, delete "aim" and insert -- arm --, therefor.

Signed and Sealed this
Tenth Day of May, 2011

David J. Kappos
*Director of the United States Patent and Trademark Office*